United States Patent
Wang

(10) Patent No.: US 10,199,395 B2
(45) Date of Patent: Feb. 5, 2019

(54) METAL OXIDE THIN FILM TRANSISTOR AND MANUFACTURING METHOD THEREOF, DISPLAY SUBSTRATE AND DISPLAY DEVICE

(71) Applicant: BOE TECHNOLOGY GROUP CO., LTD., Beijing (CN)

(72) Inventor: Meili Wang, Beijing (CN)

(73) Assignee: Boe Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/122,902

(22) PCT Filed: Jul. 17, 2015

(86) PCT No.: PCT/CN2015/084343
§ 371 (c)(1),
(2) Date: Dec. 15, 2016

(87) PCT Pub. No.: WO2016/165224
PCT Pub. Date: Oct. 20, 2016

(65) Prior Publication Data
US 2017/0092660 A1 Mar. 30, 2017

(30) Foreign Application Priority Data
Apr. 16, 2015 (CN) .......................... 2015 1 0180005

(51) Int. Cl.
*H01L 27/12* (2006.01)
*H01L 29/66* (2006.01)
(Continued)

(52) U.S. Cl.
CPC .... *H01L 27/1225* (2013.01); *H01L 21/47635* (2013.01); *H01L 27/127* (2013.01);
(Continued)

(58) Field of Classification Search
CPC ............... H01L 27/1225; H01L 27/127; H01L 29/76818; H01L 29/7869; H01L 29/78606; H01L 29/78693; H01L 29/66969
(Continued)

(56) References Cited

U.S. PATENT DOCUMENTS

2012/0256179 A1* 10/2012 Yamazaki ........... H01L 27/1225
257/43
2013/0048978 A1 2/2013 Watanabe et al.
(Continued)

FOREIGN PATENT DOCUMENTS

CN 101257048 A 9/2008
CN 101673770 A 3/2010
(Continued)

OTHER PUBLICATIONS

Decision on Rejection in Chinese Application No. 201510180005.1 dated Feb. 4, 2017, with English translation. 9 pages.
(Continued)

*Primary Examiner* — Dao H Nguyen
(74) *Attorney, Agent, or Firm* — Womble Bond Dickinson (US) LLP

(57) ABSTRACT

The present disclosure provides a metal oxide thin film transistor, wherein an oxygen deficiency adsorptive removal layer comprising an oxygen deficiency adsorptive removal material is provided between an active layer and a source, and/or between the active layer and a drain. The standard Gibbs free energy of formation of an oxide of the oxygen deficiency adsorptive removal material in a unit volume is larger than that of a metal oxide in the active layer. The present disclosure further provides a display substrate comprising the metal oxide thin film transistor and a display device comprising the display substrate.

20 Claims, 4 Drawing Sheets

(51) Int. Cl.
*H01L 29/786* (2006.01)
*H01L 21/4763* (2006.01)
*H01L 29/45* (2006.01)

(52) U.S. Cl.
CPC ........ *H01L 29/45* (2013.01); *H01L 29/66969* (2013.01); *H01L 29/7869* (2013.01); *H01L 29/78606* (2013.01); *H01L 29/78618* (2013.01); *H01L 29/78693* (2013.01)

(58) Field of Classification Search
USPC .............. 257/43, 57, 60, 288, 410, E29.095, 257/E29.273, E29.296, E29.155, E21.197, 257/E21.204, E21.409, E21.422, E21.467; 427/248.1, 255.28; 438/104, 158, 161, 438/197, 287
See application file for complete search history.

(56) References Cited

U.S. PATENT DOCUMENTS

2013/0134412 A1   5/2013   Godo et al.
2015/0270407 A1*  9/2015   Suzuki .............. H01L 29/78606
                                                          257/43
2015/0295092 A1* 10/2015   Misaki .................. G02F 1/1368
                                                          257/43

FOREIGN PATENT DOCUMENTS

CN   102194692 A   9/2011
CN   102709326 A   10/2012
CN   103904125 A   7/2014
CN   104167446 A   11/2014
CN   104779299 A   7/2015

OTHER PUBLICATIONS

Search Report in Chinese Application No. 201510180005.1 dated Sep. 25, 2015, with English translation.
Office Action in Chinese Application No. 201510180005.1 dated Dec. 8, 2015, with English translation. 9 pages.
Office Action in Chinese Application No. 201510180005.1 dated Apr. 18, 2016, with English translation. 8 pages.
International Search Report and Written Opinion in PCT/CN2015/084343 dated Jan. 19, 2016. 16 pages.
Office Action in Chinese Application No. 201510180005.1 dated Oct. 9, 2016, with English translation. 11 pages.
"Examination decision regarding request for reexamination," CN Application No. 201510180005.1 (dated May 30, 2018).
"Notice of Reexamination," CN Application No. 201510180005.1 (dated Dec. 22, 2017).

* cited by examiner

METAL OXIDE THIN FILM TRANSISTOR AND MANUFACTURING METHOD THEREOF, DISPLAY SUBSTRATE AND DISPLAY DEVICE

RELATED APPLICATIONS

The present application is the U.S. national phase entry of PCT/CN2015/084343, with an international filing date of Jul. 17, 2015, which claims the benefit of Chinese Patent Application No. 201510180005.1, filed on Apr. 16, 2015, the entire disclosures of which are incorporated herein by reference.

FIELD

The present disclosure relates to the field of display technology and particularly to a metal oxide thin film transistor and a corresponding manufacturing method, a display substrate and a display device.

BACKGROUND

With the development of information technologies, display technology as a window for acquiring information has been developed rapidly. At present, the thin film transistor liquid crystal display (TFT-LCD) has become the largest display market in the globe instead of the cathode ray tube (CRT) display. As a core element for the currently most popular flat-panel display, the performance of the thin film transistor (TFT) directly impacts on the quality of the display. Development of high mobility materials becomes a focus under increasing requirements on high PPI (pixels per inch) and high refresh rate in the field of display. Although the conventional polysilicon thin film transistor has high mobility, it cannot satisfy the requirement of large-scale production due to its complicated manufacturing process and high manufacturing cost. On the other hand, the oxide thin film transistor is suitable for large-scale production, but it has low mobility which is just 10-30 cm$^2$/Vs currently and needs to be further increased.

It is known that the calculation formula of the mobility μ of the oxide thin film transistor can be expressed as:

$$\mu = \frac{e\tau}{m^*}$$

wherein m* is an electron effective mass, τ is carrier release time.

Therefore, there are two ways to improve the mobility of the oxide thin film transistor:

(1) Increase the content of metal ions with small molecule effective mass m*. For example, in IGZO (indium gallium zinc oxide), referring to Table 1, electrons have the smallest m* in In$_2$O$_3$, thus In has the most predominant effect on improving the mobility of the thin film transistor. Increasing the content of In$^{3+}$ ions in the oxide can improve the mobility of the oxide thin film transistor significantly. However, the In$^{3+}$ ions have the largest orbital radius, and the bond energy between In$^{3+}$ and O is the smallest, thus the formed In—O bond is easily broken, thereby forming some oxygen dangling bonds or redundant oxygen defects, which in turn influences the stability of the thin film transistor.

TABLE 1

|  | In—O | Zn—O | Ga—O |
| --- | --- | --- | --- |
| ionic bond energy | weak | medium | strong |
| metal ion radius | 0.81 Å | 0.74 Å | 0.62 Å |
| effective mass m* | small | medium | large |

(2) Reduce the number of defects in the oxide which impact on carrier transmission. The carrier relaxation time is most affected by the defects. Specifically, reducing the number of defects in the oxide can increase the carrier relaxation time, thereby improving the mobility of the thin film transistor.

SUMMARY

The applicant has discovered that particular materials have strong oxygen deficiency adsorptive removal capabilities. By forming an oxygen deficiency adsorptive removal layer between the active layer and the source/drain electrode, redundant oxygen dangling bonds and oxygen defects can be adsorptively removed to increase the carrier relaxation time, thereby reaching the purpose of improving the mobility of the metal oxide thin film transistor. To this end, the oxide of the material acting as the oxygen deficiency adsorptive removal layer should be more stable than the metal oxide in the active layer.

To explore materials suitable for the oxygen deficiency adsorptive removal layer of the oxide thin film transistor, the stabilities of multiple oxides would be determined based on the standard Gibbs free energies of formation of the oxides in a unit volume. The standard Gibbs free energy of formation of a compound is a measure for determining whether it is easy for the compound to decompose into corresponding elementary substances, that is, the larger the standard Gibbs free energy of formation is, the more stable the compound is; contrarily, it is easier for the compound to decompose into corresponding elementary substances.

FIG. 1 illustrates a chart showing variations in the standard Gibbs free energies of formation of common oxides in a unit volume, wherein at certain temperatures, in the case of $\Delta_r G_m < 0$, the reaction of generating an oxide from corresponding elementary substances in standard state can take place spontaneously, and the smaller the value of $\Delta_r G_m$ is (i.e. the larger the absolute value is), the stronger the stability of the oxide is, and it would decompose into elementary substances less easily. It can be seen that at certain temperatures, the stabilities of oxides of the materials such as Hf, Ti, Be, Al and Ca are all strong. The materials whose oxides have strong stability can adsorptively remove weak oxygen dangling bonds and oxygen defects from the oxides with weak stability.

In view of the above, a first aspect of the present disclosure provides a metal oxide thin film transistor, wherein an oxygen deficiency adsorptive removal layer comprising an oxygen deficiency adsorptive removal material may be provided between the active layer and the source, and/or between the active layer and the drain. The standard Gibbs free energy of formation of the oxide of the oxygen deficiency adsorptive removal material in a unit volume is larger than that of the metal oxide in the active layer.

In the metal oxide thin film transistor, the oxygen deficiency adsorptive removal layer having strong oxygen adsorptive removal capability (i.e. the standard Gibbs free energy of formation of the corresponding oxide in a unit volume is large) can adsorptively remove weak oxygen dangling bonds and oxygen defects from the active layer of the metal oxide, thereby effectively improving the mobility of the metal oxide thin film transistor. In embodiments, the oxygen deficiency adsorptive removal layer can be arranged between the source and the active layer, or arranged between the drain and the active layer, or particularly the both to further improve the mobility of the metal oxide thin film transistor.

In accordance with an embodiment of the present disclosure, the oxygen deficiency adsorptive removal layer may have a thickness ranging from 100 to 3000 Å. The thickness of the oxygen deficiency adsorptive removal layer is related to the thickness and material of the active layer, and the concentrations of the oxygen dangling bonds and oxygen defects. When the active layer is relatively thick, the metal oxide in the active layer is relatively stable or the concentrations of the oxygen dangling bonds and oxygen defects are relatively high, the thickness of the oxygen deficiency adsorptive removal layer can be increased accordingly. It is to be noted that those skilled in the art can design and implement oxygen deficiency adsorptive removal layers with different thicknesses based on practical needs.

In accordance with another embodiment of the present disclosure, the oxygen deficiency adsorptive removal material may be selected from the group consisting of Hf, Ti, Be, Al, Si and Ca. It can be seen from FIG. 1 that the oxides of the above materials have excellent stabilities and are hence very suitable for acting as the oxygen deficiency adsorptive removal layer in the metal oxide thin film transistor.

In accordance with a further embodiment of the present disclosure, the oxygen deficiency adsorptive removal material may be identical with the materials of the source and the drain. In this case, oxygen deficiency adsorptive removal layer can be formed simultaneously with the source and drain, which consequently does not involve additional process steps and leads to simple manufacture and reduced cost.

In accordance with yet another embodiment, the metal oxide in the active layer may be selected from oxides of Zn, In, Sn and Ga. It can also be seen from FIG. 1 that the above oxides have low stability, thus there are several materials suitable for acting as the oxygen deficiency adsorptive removal layer in the metal oxide thin film transistor accordingly.

In addition, in accordance with an embodiment of the present disclosure, the metal oxide in the active layer may comprise a metal nitrogen oxide.

A second aspect of the present disclosure provides a method for manufacturing a metal oxide thin film transistor, which may comprise: forming, on a substrate, a gate layer, a gate insulating layer and an active layer successively, and performing patterning process treatment on each layer; forming, on the active layer, an oxygen deficiency adsorptive removal layer comprising an oxygen deficiency adsorptive removal material; forming a source/drain electrode layer; performing patterning process treatment on the source/drain electrode layer and the oxygen deficiency adsorptive removal layer, wherein the oxygen deficiency adsorptive removal layer is between the active layer and the source, and/or between the active layer and the drain, and the standard Gibbs free energy of formation of the oxide of the oxygen deficiency adsorptive removal material in a unit volume is larger than that of the metal oxide in the active layer.

In the metal oxide thin film transistor prepared by the above method, the oxygen deficiency adsorptive removal layer having strong oxygen adsorptive removal capability (i.e. the standard Gibbs free energy of formation of the corresponding oxide in a unit volume is large) can adsorptively remove weak oxygen dangling bonds and oxygen defects in the active layer of the metal oxide, thereby effectively improving the mobility of the metal oxide thin film transistor. In embodiments, the oxygen deficiency adsorptive removal layer can be arranged between the source and the active layer, or arranged between the drain and the active layer, or particularly the both to further improve the mobility of the metal oxide thin film transistor.

In accordance with an embodiment of the present disclosure, the above method may further comprise an annealing step after forming the source/drain electrode layer. The annealing step can expedite the adsorptive removal of the oxygen defects and oxygen dangling bonds in the active layer by the oxygen deficiency adsorptive removal layer, which is hence more advantageous to carrier transmission and thereby improves the mobility of the metal oxide thin film transistor.

In accordance with another embodiment of the present disclosure, the annealing step may be performed at a temperature ranging from 100 to 350° C. for 30 to 90 minutes. Suitable annealing process can improve the mobility of the device and improve important parameters such as threshold voltage and current on-off ratio so as to improve the performance of the device. However, the annealing temperature should not be too high. If the annealing temperature is too high, the mobility of the metal oxide thin film transistor would decrease as the temperature increases.

In accordance with an embodiment of the present disclosure, the above method may further comprise a step of forming a passivation layer above the resultant metal oxide thin film transistor.

The present disclosure further provides a display substrate comprising the metal oxide thin film transistor according to the first aspect of the present disclosure and a display device comprising the display substrate. They have features and advantages similar to those described above for the metal oxide thin film transistor, which are not described here in detail for simplicity.

BRIEF DESCRIPTION OF DRAWINGS

Other purposes and features of the present disclosure would become apparent from the detailed description below with reference to the drawings. However, it is to be understood that the figures are shown only for illustrative purpose rather than restrictive purpose, and the figures are not necessarily plotted to scale. In the drawings.

DETAILED DESCRIPTION

Throughout the respective figures, the same reference sign denotes the same portion specifically as follows, 1: gate layer; 2: gate insulating layer; 3: active layer; 4: source; 5: drain; 6: oxygen deficiency adsorptive removal layer; 7: passivation layer; 8: etch stop layer (ESL).

Figure 1:
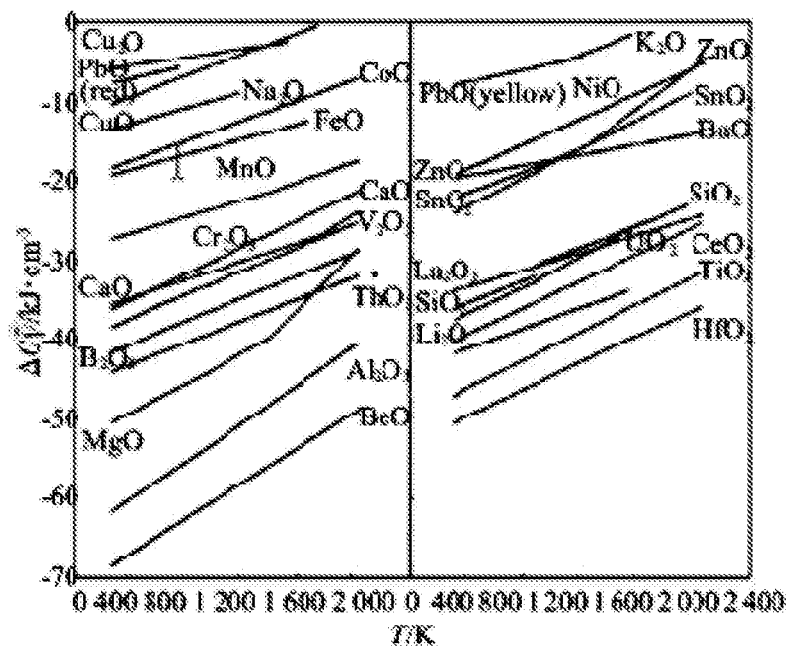
FIG. 1 shows a chart showing variations in the standard Gibbs free energies of formation of common oxides in a unit volume.
Figure 2:
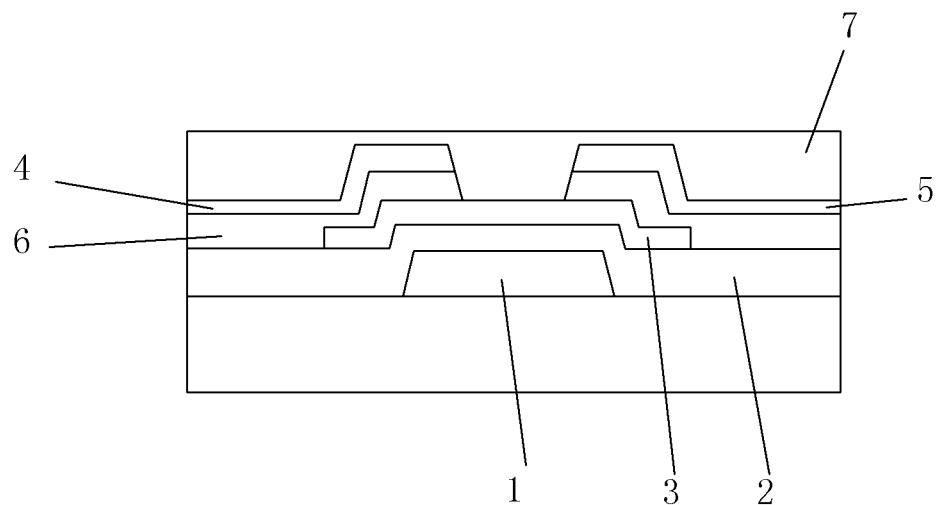
FIG. 2 shows a cross sectional view of a metal oxide thin film transistor that employs a bottom gate BCE structure according to embodiments of the present disclosure.

FIG. 2 shows a cross sectional view of a metal oxide thin film transistor that employs a bottom gate BCE structure according to embodiments of the present disclosure. As shown in FIG. 2, the thin film transistor comprises, on a substrate, a gate layer 1, a gate insulating layer 2, an active layer 3, a source 4 and a drain 5, and a passivation layer 7 above the device. The gate insulating layer 2 is arranged between the gate layer 1 and the active layer 3, the source 4 and the drain 5 are arranged above the active layer 3, and the active layer 3 may be formed by a metal oxide, or particularly a metal nitrogen oxide. The thin film transistor further comprises an oxygen deficiency adsorptive removal layer 6 comprising an oxygen deficiency adsorptive removal material arranged between the active layer 3 and the source 4 and between the active layer 3 and drain 5, wherein the standard Gibbs free energy of formation of the oxide of the oxygen deficiency adsorptive removal material in a unit volume is larger than that of the metal oxide in the active layer 3. Therefore, the oxygen deficiency adsorptive removal layer 6 having strong oxygen adsorptive removal capability can adsorptively remove weak oxygen dangling bonds and oxygen defects from the metal oxide active layer 3, thereby effectively improving the mobility of the thin film transistor.

It is to be noted that although FIG. 2 shows that the oxygen deficiency adsorptive removal layer 6 is arranged between the active layer 3 and both of the source 4 and drain 5, those skilled in the art can conceive and comprehend that the oxygen deficiency adsorptive removal layer 6 may also be only arranged between the source 4 and the active layer 3, or only arranged between the drain 5 and the active layer 3.

The oxygen deficiency adsorptive removal layer 6 may have a thickness ranging from 100 to 3000 Å, and the oxygen deficiency adsorptive removal material may be selected from the group consisting of Hf, Ti, Be, Al, Si and Ca. In practice, those skilled in the art can design and implement the oxygen deficiency adsorptive removal layer 6 of different thicknesses and materials according to the thicknesses and materials of the active layer 3, the concentrations of the oxygen dangling bonds and oxygen defects, etc.

The metal oxide in the active layer 3 may be selected from oxides or nitrogen oxides of Zn, In, Sn and Ga. In addition, the source 4 and the drain 5 may employ the metal Mo.

Figure 3:
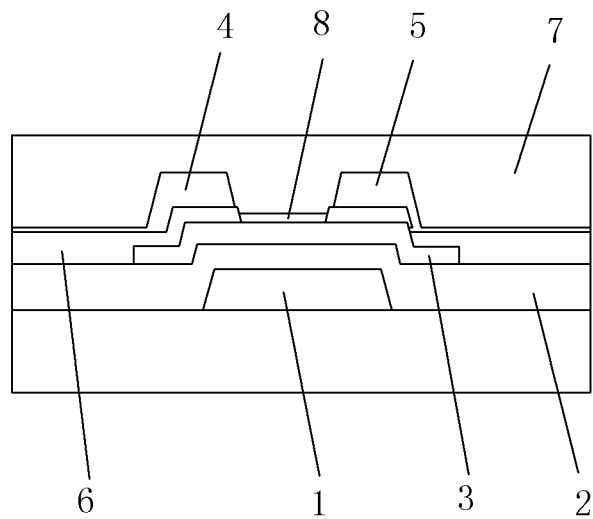
FIG. 3 shows a cross sectional view of a metal oxide thin film transistor that employs a bottom gate ESL structure according to embodiments of the present disclosure.

FIG. 3 shows a cross sectional view of a metal oxide thin film transistor that employs a bottom gate ESL structure according to embodiments of the present disclosure. The structure in FIG. 3 is substantially similar to the structure in FIG. 2, which is only different in that the thin film transistor further comprises an etch stop layer (ESL) 8 arranged on the active layer 3 between the source 4 and the drain 5.

FIG. 2 and FIG. 3 both employ a bottom gate type structure. Since the metal gate and the gate insulating layer of the thin film transistor of a bottom gate type structure can act as an optical protective layer of the semiconductor layer so as to protect the electrical properties of the semiconductor layer from damage by the photo-induced carriers resulting from irradiation of light emitted by the backlight source onto the semiconductor layer, the thin film transistor of a bottom gate type structure is stable in performance.

Figure 4:
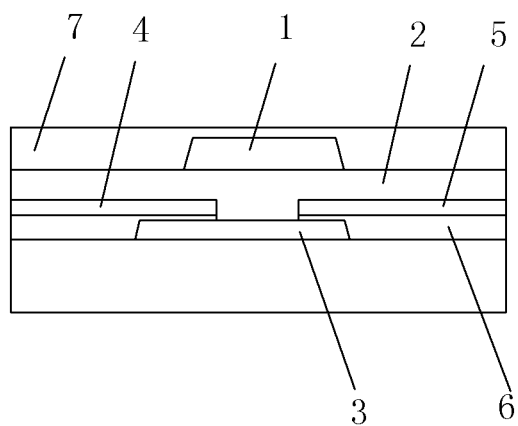
FIG. 4 shows a cross sectional view of a metal oxide thin film transistor that employs a top gate structure according to embodiments of the present disclosure.

FIG. 4 shows a cross sectional view of a metal oxide thin film transistor that employs a top gate structure according to embodiments of the present disclosure. The structure in FIG. 4 differs from the structure in FIG. 2 in that in FIG. 4 the active layer 3 is arranged on the substrate, on which the source 4 and the drain 5 are arranged, the gate insulating layer 2 is located above the source 4 and the drain 5, and the gate layer 1 is arranged on a side of the gate insulating layer 2 away from the source 4 and the drain 5. Likewise, the oxygen deficiency adsorptive removal layer 6 is arranged between the active layer 3 and the source 4 and between the active layer 3 and drain 5, and the oxygen deficiency adsorptive removal layer 6 may be only arranged between the active layer 3 and the source 4 or only arranged between the active layer 3 and the drain 5 as required.

The thin film transistor of a top gate structure in FIG. 4 has advantages including simple manufacture process, a small number of masks as required, low cost, and the like.

Figure 5:
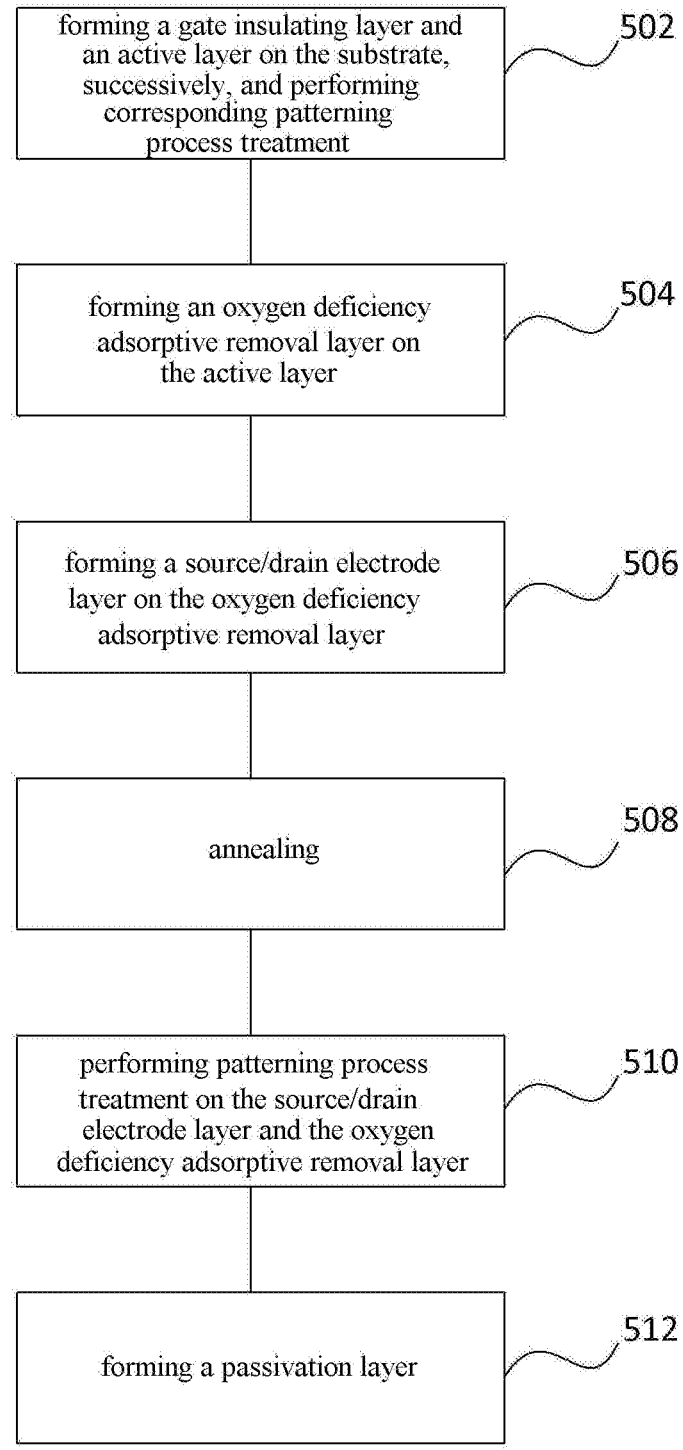
FIG. 5 shows a flow chart of a method for manufacturing a metal oxide thin film transistor of a bottom gate BCE structure according to embodiments of the present disclosure.
Figure 6A:
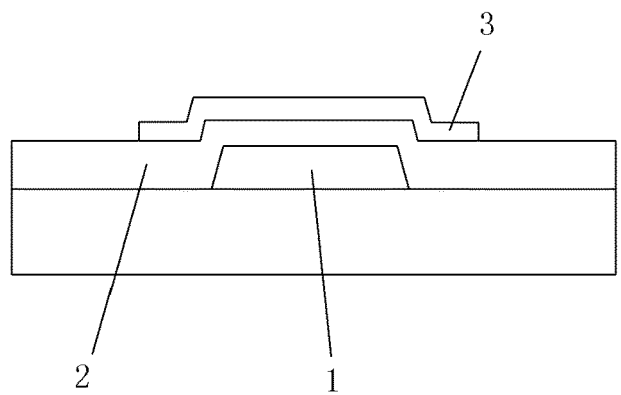
FIGS. 6(a)-(c) show schematic views of some steps in the method shown in FIG. 5, respectively.
Figure 6B:
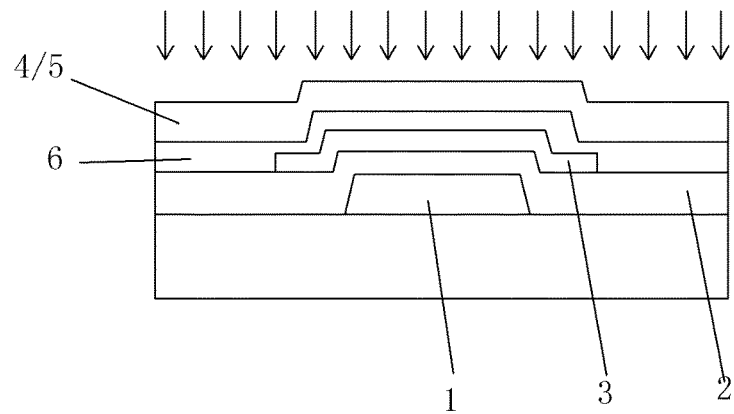
Figure 6C:
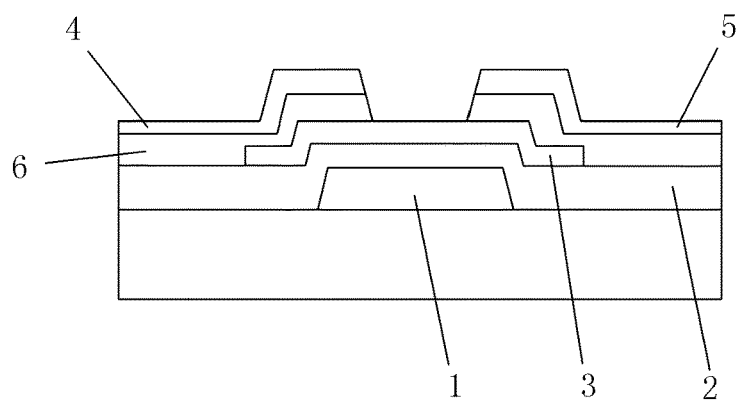

FIG. 5 shows a flow chart of a method for manufacturing a metal oxide thin film transistor of a bottom gate BCE structure according to embodiments of the present disclosure, and FIGS. 6(a)-6(c) show schematic views of some steps in the method shown in FIG. 5, respectively. The method comprises at step 502 forming, on the substrate, a gate layer 1, a gate insulating layer 2 and an active layer 3 successively, and performing patterning process treatment on each layer, as shown in FIG. 6(a). In step 502, a variety of film forming processes known in the art, e.g. sputtering, chemical vapor deposition, and so on, can be used, and patterning processes known in the art including lithographic process, etching process, and so on can be employed.

At step 504, an oxygen deficiency adsorptive removal layer 6 is formed on the active layer 3. At step 506, a source/drain electrode layer is to be formed on the oxygen deficiency adsorptive removal layer 6. Particularly, the oxygen deficiency adsorptive removal layer 6 and the source/drain electrode layer are formed by the same material. In this case, step 504 and step 506 can be carried out simultaneously. In addition, the oxygen deficiency adsorptive removal layer 6 may also be only present between the active layer 3 and the source or between the active layer 3 and the drain.

At step 508, an annealing process is carried out. As shown in FIG. 6(b), the arrows represent the direction of annealing. The temperature for annealing ranges from 100 to 350° C. and the time for annealing is 30 to 90 minutes. In some cases, step 508 can be omitted.

At step 510, patterning process treatment is performed on the source/drain electrode layer and the oxygen deficiency adsorptive removal layer 6, as shown in FIG. 6(c), wherein patterning processes known in the art including lithographic process, etching process, and so on can be employed.

Finally, at step 512, a passivation layer 7 is formed above the device to obtain the structure shown in FIG. 2. In some cases, step 512 can be omitted.

It is to be noted that the method disclosed by the present disclosure is not limited to the order recited for the method. Some steps may be performed simultaneously with other steps and some steps may be omitted.

While the disclosure has been illustrated and described in detail in the drawings and foregoing description, such illustration and description are to be considered illustrative or exemplary and not restrictive; the disclosure is not limited to the disclosed embodiments.

Variations to the disclosed embodiments can be understood and effected by the skilled person in practicing the claimed invention, from a study of the drawings, the disclosure, and the appended claims. The mere fact that certain measures are recited in mutually different dependent claims does not indicate that a combination of these measures cannot be used to advantage.

The invention claimed is:

1. A metal oxide thin film transistor, wherein an oxygen deficiency adsorptive removal layer comprising an oxygen deficiency adsorptive removal material is provided between an active layer and a source, and/or between the active layer and a drain, and the standard Gibbs free energy of formation of an oxide of the oxygen deficiency adsorptive removal material in a unit volume is larger than that of a metal oxide in the active layer.

2. The metal oxide thin film transistor according to claim 1, wherein the oxygen deficiency adsorptive removal layer has a thickness ranging from 100 to 3000 Å.

3. The metal oxide thin film transistor according to claim 1, wherein the oxygen deficiency adsorptive removal material is selected from the group consisting of Hf, Ti, Be, Al, Si and Ca.

4. The metal oxide thin film transistor according to claim 1, wherein the oxygen deficiency adsorptive removal material is the same as materials of the source and the drain.

5. The metal oxide thin film transistor according to claim 1, wherein the metal oxide in the active layer is selected from oxides of Zn, In, Sn and Ga.

6. The metal oxide thin film transistor according to claim 1, wherein the metal oxide in the active layer comprises a metal nitrogen oxide.

7. A display substrate comprising the metal oxide thin film transistor according to claim 1.

8. A display device comprising the display substrate according to claim 7, the display substrate comprising a metal oxide thin film transistor, in the metal oxide thin film transistor, an oxygen deficiency adsorptive removal layer comprising an oxygen deficiency adsorptive removal material is provided between an active layer and a source, and/or between the active layer and a drain, and the standard Gibbs free energy of formation of an oxide of the oxygen deficiency adsorptive removal material in a unit volume is larger than that of a metal oxide in the active layer.

9. The display device according to claim 8, wherein the oxygen deficiency adsorptive removal layer has a thickness ranging from 100 to 3000 Å.

10. The display device according to claim 8, wherein the oxygen deficiency adsorptive removal material is selected from the group consisting of Hf, Ti, Be, Al, Si and Ca.

11. The display device according to claim 8, wherein the oxygen deficiency adsorptive removal material is the same as materials of the source and the drain.

12. The display substrate according to claim 7, wherein the oxygen deficiency adsorptive removal layer has a thickness ranging from 100 to 3000 Å.

13. The display substrate according to claim 7, wherein the oxygen deficiency adsorptive removal material is selected from the group consisting of Hf, Ti, Be, Al, Si and Ca.

14. The display substrate according to claim 7, wherein the oxygen deficiency adsorptive removal material is the same as materials of the source and the drain.

15. The display substrate according to claim 7, wherein the metal oxide in the active layer is selected from oxides of Zn, In, Sn and Ga.

16. The display substrate according to claim 7, wherein the metal oxide in the active layer comprises a metal nitrogen oxide.

17. A method for manufacturing a metal oxide thin film transistor, comprising steps of:
    forming, on a substrate, a gate layer, a gate insulating layer and an active layer successively, and performing patterning process treatment on each layer;
    forming, on the active layer, an oxygen deficiency adsorptive removal layer comprising an oxygen deficiency adsorptive removal material;
    forming a source/drain electrode layer;
    performing patterning process treatment on the source/drain electrode layer and the oxygen deficiency adsorptive removal layer,
    wherein the oxygen deficiency adsorptive removal layer is between the active layer and the source, and/or between the active layer and the drain, and the standard Gibbs free energy of formation of an oxide of the oxygen deficiency adsorptive removal material in a unit volume is larger than that of a metal oxide in the active layer.

18. The method according to claim 17, further comprising an annealing step after forming the source/drain electrode layer.

19. The method according to claim 18, wherein the annealing step is performed at a temperature of 100 to 350° C. for 30 to 90 minutes.

20. The method according to claim 17, further comprising a step of forming a passivation layer above a resultant metal oxide thin film transistor.

* * * * *